United States Patent
Naas et al.

(10) Patent No.: US 12,035,499 B2
(45) Date of Patent: Jul. 9, 2024

(54) STABILITY APPLIANCE FOR SECURING CIRCUIT BOARDS IN HARSH ENVIRONMENTS

(71) Applicant: Intel Corporation, Santa Clara, CA (US)

(72) Inventors: Nico Naas, Karlsruhe (DE); Juergen D. Felleisen, Baden-Baden (DE); Michael Windig, Rauenberg (DE); Talal Arnaout, Walzbachtal (DE)

(73) Assignee: Intel Corporation, Santa Clara, CA (US)

( * ) Notice: Subject to any disclaimer, the term of this patent is extended or adjusted under 35 U.S.C. 154(b) by 773 days.

(21) Appl. No.: 17/031,945

(22) Filed: Sep. 25, 2020

(65) Prior Publication Data

US 2021/0059066 A1 Feb. 25, 2021

(51) Int. Cl.
| | |
|---|---|
| H05K 7/00 | (2006.01) |
| H05K 5/00 | (2006.01) |
| H05K 7/14 | (2006.01) |
| H05K 7/20 | (2006.01) |
| B60R 16/023 | (2006.01) |

(52) U.S. Cl.
CPC ......... *H05K 7/1402* (2013.01); *H05K 5/0026* (2013.01); *H05K 7/2039* (2013.01); *B60R 16/023* (2013.01)

(58) Field of Classification Search
CPC .. H05K 7/1402; H05K 5/0026; H05K 7/2039; B60R 16/023
See application file for complete search history.

(56) References Cited

U.S. PATENT DOCUMENTS

| | | | | |
|---|---|---|---|---|
| 7,791,881 | B2* | 9/2010 | Chou | H01L 23/467 |
| | | | | 361/716 |
| 2017/0231117 | A1* | 8/2017 | Yu | F28F 1/02 |
| 2022/0141990 | A1* | 5/2022 | Gupta | H05K 7/2039 |
| | | | | 361/709 |
| 2022/0322565 | A1* | 10/2022 | Lee | H05K 7/2039 |

FOREIGN PATENT DOCUMENTS

| | | | | |
|---|---|---|---|---|
| DE | 102012219693 A1 * | 5/2013 | ......... | F28D 15/0275 |
| WO | WO-2011110390 A1 * | 9/2011 | ........... | H01L 23/467 |

\* cited by examiner

*Primary Examiner* — Pete T Lee
(74) *Attorney, Agent, or Firm* — Viering, Jentschura & Partner mbB

(57) ABSTRACT

A stability device comprising a carrier having a first socket and a second socket; a first circuit board inserted into the first socket; a second circuit board inserted into the second socket, wherein an inside surface of the second circuit board is facing an inside surface of the first circuit board; a center structure positioned between the inside surface of the first circuit board and the inside surface of the second circuit board, wherein the center structure is fixed to the carrier via a stability bar fixed to the carrier; a spring loaded outer structure at least partially surrounding an outside surface of the first circuit board and an outside surface of the second circuit board and to fix the center structure between the inside surface of the first circuit board and the inside surface of the second circuit board, wherein the center structure and outer structure dissipate heat.

20 Claims, 12 Drawing Sheets

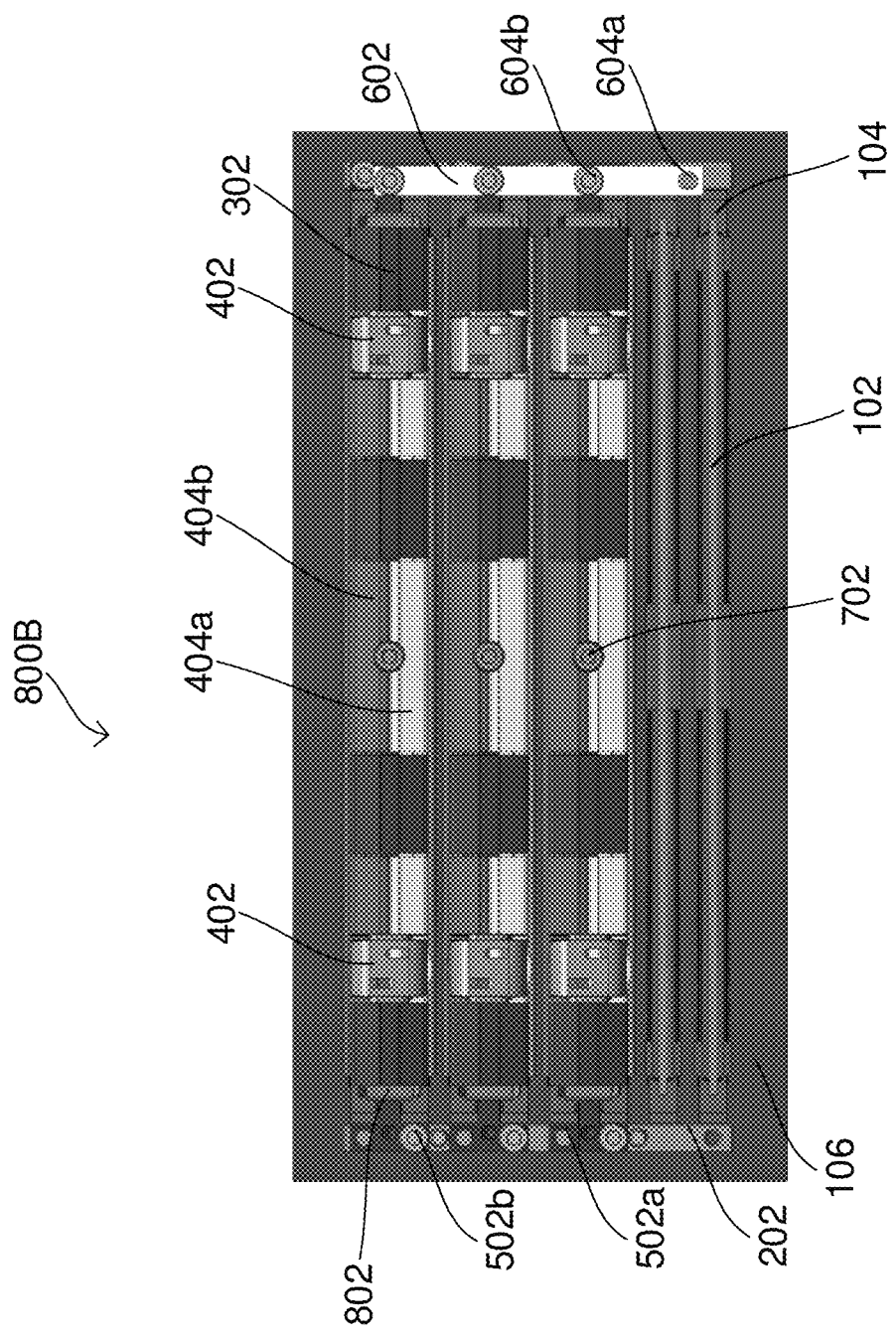

STABILITY APPLIANCE FOR SECURING CIRCUIT BOARDS IN HARSH ENVIRONMENTS

TECHNICAL FIELD

Various aspects relate generally to the field of memory circuit boards. More particularly devices and methods of securing memory circuit boards to avoid damage to the memory circuit boards.

BACKGROUND

Socketed memory circuit boards in harsh environments may be prone to damage and/or device failure. Socketed dual in-line memory modules (DIMMs) may be damaged due to shock and/or vibration stress in harsh environments such as vehicles. Introducing additional stiffening elements to a system of socketed DIMMs can reduce the ability to dissipate heat. Because vibrations may damage DIMMs in a vehicle, stabilizing DIMMs in harsh environments to prevent them from deforming without preventing heat from dissipating is desirable.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. It should be understood that the drawings are diagrammatic and schematic representations of exemplary aspects of the invention, and are neither limitative nor necessarily drawn to scale of the present invention.

In the following description, various aspects of the invention are described with reference to the following drawings, in which:

FIGS. 8A and 8B show exemplary elements for securing DIMMs to a printed circuit board (PCB) according to some aspects.

DESCRIPTION

Figure 1:
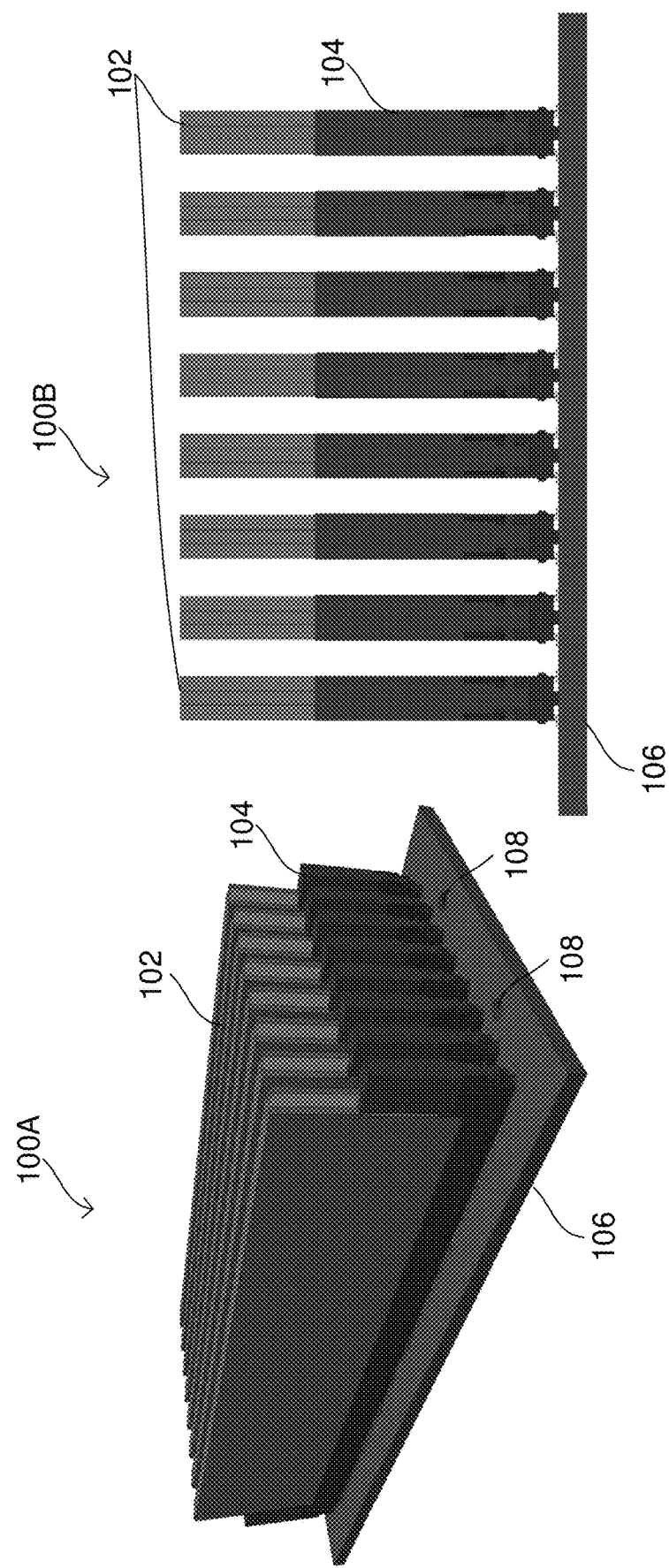
FIG. 1 shows views of a system of socketed dual in-line memory modules (DIMMs)

The following detailed description refers to the accompanying drawings that show, by way of illustration, specific details and aspects in which this disclosure is practiced.

The word "exemplary" is used herein to mean "serving as an example, instance, or illustration." The words "plurality" and "multiple" in the description and claims refer to a quantity greater than one. The terms "group," "set", "sequence," and the like refer to a quantity equal to or greater than one. Any term expressed in plural form that does not expressly state "plurality" or "multiple" similarly refers to a quantity equal to or greater than one. The term "lesser subset" refers to a subset of a set that contains less than all elements of the set.

Various features are grouped together for the purpose of streamlining the disclosure. This method of disclosure is not to be interpreted as reflecting an intention that the claims require more features than are expressly recited in each claim. Rather, as the following claims reflect, inventive subject matter lies in less than all features of a single disclosed aspect. Thus the following claims are hereby incorporated into the Detailed Description, with each claim standing on its own as a separate aspect.

Adhesives may secure DIMMs to DIMM sockets to prevent DIMMs from relative movement due to shock and vibrations. For example, epoxy, hot glue or similar adhesives. However, it is difficult to ensure that adhesives are applied uniformly. Additionally, adhesives are often applied at a base of the DIMM near the point it is inserted into the DIMM socket or the PCB. This offers weak support for the DIMM because the portions of the DIMM farthest away from the DIMM socket still have a relatively large range of motion. The lever created by the DIMM rising perpendicular to the surface of the PCB increases the forces acting against the interfaces at the base, which can easily lead to damage. Shock and vibrations may cause damage to DIMMs if they have a large range of motion. To prevent relative movement of the DIMMs, it is necessary to fix the DIMM in all spatial axes relative to the socket.

Additionally, the inclusion of adhesives or other materials may partially fill the space between DIMMs. The partially filled space reduces the airflow between DIMMs necessary for cooling DIMMs, thus reducing the maximum tolerable ambient temperature instead of increasing it. Removing or replacing DIMMs that have been damaged is less feasible when DIMMs are glued to sockets or the PCB. Subsequently, removing supportive glue from DIMMs and sockets may damage the DIMMs and/or sockets.

This disclosure provides various aspects for preventing DIMMs from moving in environments prone to vibration. In some aspects, an inner structure that fits between two DIMMs may prevent the DIMMs from moving in an inward direction. Outer clamping plates may clamp to the outside surfaces of the DIMMs and the center plate. Placing the outer clamping plates so that they clamp to the outer surfaces of the DIMMs and press them against the center plate to prevent the DIMMs from moving in an outward direction and provide stability. Together the clamping plates and the center plate provide stability to the DIMMs in an environment prone to vibrations and reduce the risk of damage to the DIMMs, sockets, and PCB.

The inner structure and the outer structure may reduce air flow between DIMMs required for heat dissipation. In some aspects, the inner structure and the outer structure made from a thermal conductive material may form a heat sink. For example, fixing the inner structure and the outer structure to each other at a point above the DIMMs and configured with fins to create more cooling surface area and dissipate heat. Placing a thermal interface material (TIM) between the inner and outer structures and the DIMMs may further improve heat dissipation.

The thermal conductive material may be Aluminum, Copper, Silver, Magnesium or other thermal conductive metals.

In some aspects, a stability bar secured to the PCB may offer additional stability to the DIMMs. Securing the center plate positioned between two DIMMs to the stability bar and further securing outer plates to the center plate prevents movement of DIMM relative to the socket it is inserted into. Additionally, plates configured with a heat sink and made of thermal conductive material provide higher ambient temperature tolerance.

Securing and supporting DIMMs against movement, while introducing a cooling mechanism, provides benefits in environments prone to vibrations such as vehicles or other transportation solutions. These techniques may be done without the need to change the architecture of the mainboard, making it relatively easy and inexpensive to implement. Some aspects, may be applicable to other server products, such as server blades, into nontraditional and future markets. For example, new automotive segments include MaaS/TaaS (Mobility as a Service/Transportation as a Service) vehicles or other adjacent transportation markets.

DIMMs configured in environments where vibrations often occur are at greater risk of failure. Shock and vibration stress may cause damage and lead to failure in harsh environments. Devices used to stabilize DIMMs may reduce air flow and cause damage or failure due to lack of heat dissipation. DIMM movement relative to their sockets creates unwanted friction at the interface between the DIMM and the socket and may harm DIMMs or sockets. Additionally, harsh environments may cause damage to DIMMs such as socket spring connectors wearing out, contacts wearing out, solder joints breaking, PCB and connector parts deforming. Additional support and improved cooling for DIMMs are required to prevent failure of devices in harsh environments.

In some aspects, a PCB may include DIMM sockets and one or more stability bars. The stability bars made from steel may absorb forces cause by shock and vibration. Stability bars may include threaded holes, and screws may secure the stability bars at opposite ends of the DIMM sockets on the PCB. Steel stability bars ensure that the threading for the screws is stable. Screws may secure the stability bar to the PCB at key out positions and act as ground reference. At other points between the stability bars and PCB, they may create a gap. Minimizing the contact points between the stability bars and the PCB reduces the effect on the PCB layout and electrical noise, such as electromagnetic interference.

DIMMs plugged into the DIMM sockets may require support to prevent movement. Screws may secure a center plate positioned between two DIMMs to the stability bar. Each center plate may be secured to stability bars at each end. The center plate made from thermal conductive material may serve as a heat spreader and a heat sink. The center plate may be configured with fins at a position above the DIMMs to aid in heat dissipation.

A clamping structure may include two outer plates, a clamping spring, and a center plate. The clamping spring may secure the outer plates against the outer surfaces of the DIMMs and the inner surfaces DIMMs against the center plate. Because the center plate is secured to the stability bar, the clamping structure prevents the DIMMs from moving relative to the PCB. The clamping spring of the clamping structure may tolerate clamping DIMMs in their full range of thickness and maintain pressure over the lifetime of the device. The clamping structure may include one or more clamping springs. Each clamping spring may be configured with a different clamping force as needed. The clamping springs may be any of flat springs, wire springs, spiral springs, air pressure springs, torsion springs, compression springs, extension springs, leg springs, rubber springs or combinations of them. The outer plates may be created using different processes including: machined or non-machined extruded profiles; high pressure die casting; 3D additive metal printing; machining from billet material. Other processes may be used to create the outer plates.

The outer plates made from thermal conductive material may serve as a heat spreader and a heat sink. Other elements of this disclosure, alone or in combination, may also serve as a heat spreader and a heat sink. For example, the outer plates may be configured with fins to interweave with the centers plate's fins to serve as a heat sink and aid in heat dissipation. Placing a TIM between the DIMMs and the center and outer plates further aids in heat dissipation. For example, a TIM with thermal conductivity k greater than or equal to 1.5 ($>1.5$ $W \cdot m^{-1} \cdot K^{-1}$). A good TIM may improve the thermal contact between hot spots and the heat sinks. One example of a TIM is a one-sided adhesive phase change TIM. This will cover irregularities and unparallel surfaces, as it melts and dispenses at working temperature and guarantees a very good contact of heat source to heat sink. The center plate and outer plates may transport heat to the sink fins to increase cooling performance. Fins on a top portion of the center plate and outer plates, above the DIMMs, may improve cooling even more, compared to the tightly packed DIMMs. The ruggedized heat sink appliance is a pre-assembled device, which will be installed in a pre-opened condition, as seen in FIG. 4B. In the pre-opened condition the heat sink appliance may be installed over already installed DIMMs and fixed to the stability bar. This may be done without interfering with the DIMMs.

Fixing each center plate to one or more stability bars mechanically connects the heat sink created by the outer and center plates and supports the DIMMs in their sockets while improving heat dissipation. it prevents relative movement induced by shock and vibration of DIMM to socket by clamping 2 DIMMs against the center plate. The ruggedized heat sink appliance may be installed over a single DIMM. If the device is installed over a single DIMM, the force of the clamping spring will position one outer plate against the single DIMM and the other outer plate against the center plate.

Additional stability bars may be secured to a top portion of the center plates. Screws may secure the additional stability bars to the center plates. The additional stability bars prevent relative movement of the DIMMs to the socket and reduce the stress on the connectors from shock and vibration. The additional stability bars may also serve as a heat spreader and/or heat sink in addition to providing mechanical stiffness.

U-wires may attach the outer plates to the center plate. Both ends of the outer plates and the center plate may be configured with holes for the u-wires. Opening the clamping structure moves the outer plates up and away from the DIMMs in a parallel swing motion. The layout of the u-wires in their bearings creates a parallelogram with the center plate an the outer plates. The parallel swing motion provides the most clearance to mount and unmount the pre-assembly when opening and closing the clamping structure. Closing the clamping structure moves the outer plates down and toward the DIMMs. A closed clamping structure positions the outer plates against the DIMMs and secures them to the center plate. U-wires may guide movement of the outer plates relative to the center plate. The center plate acts as a fixed bearing with reference to the movement of the outer plates. A retention spring at each end of the center plate may keep the u-wires in place. The retention spring prevents the u-wires from sliding out of the center plate and outer plates, but allows them to rotate around the center plate to open and close the clamping structure. Alternatively, the u-wires may be fixed to the center plate and/or the outer plates by a form or snap fit that does not prevent rotation and thus function in its bearings.

According to some aspects, u-wires may guide motion of the outer plates in a parallel swing. However, it should be understood that other mechanisms may be used. For example, a scissor mechanism including a rotational motion, a lever mechanism like a clothespin, a mechanism where the axis of rotation is perpendicular to the PCB, or other mechanical principles may guide the movement the outer plates of the clamping structure when opening and closing.

A central screw may displace a nut bar that opens and closes the clamping structure. The center plate may include and guide a screw driven nut bar for opening and closing the outer plates along the DIMMs. Turning the screw clockwise into the moving nut bar against the force of the clamping spring to open the clamping structure and pushes the outer plates away from the DIMMs. U-wires attaching the center plate and outer plates at opposite ends guide the movement of the outer plates in a parallel swing motion. When the nut bar is in the open position and the outer plates are not in contact with the DIMMs, the screws that fix the center plate to the stability bars are removed to remove the pre-assembled clamping structure. The nut bar may be configured to include a top position where turning the screw clockwise no longer moves the nutbar and a bottom position where turning the screw coutnerclockwise no longer moves the nutbar. The top position is associated with the a maximum open position. When the pre-assembled clamping structure is removed, DIMMs may be replaced and the pre-assembled clamping structure may be reinstalled. Turning the screw counterclockwise moves the nut to allow the force of the clamping spring to close the outer plates around the DIMMs and the center plate. The opening/closing mechanism may include one or more screws.

Alternatively, the clamping structure may operate like a spring loaded clothes pin. The outer plates may be opened when pressure is applied to one end of the outer plates acting against the spring force to open the opposite ends of the outer plates. In the open position, the clamping structure may be placed over the DIMMs and center plate. When released, the spring forces the opposite ends of the outer plates to clamp over the DIMMs and center plate. The clamping structure may be one piece instead of two outer plates and a spring.

Alternatively, the opening/closing mechanism may employ an excenter lever instead of a screw. The lever may lift an opening bar, similar to the nut bar previously mentioned, and have then the same effect as turning the screw clockwise. For example, one or more levers may press the outer plates into an open position by using a double sided wedge. Alternatively, the one or more levers may drive one or more threaded rods against the outer plates into the open position.

A maximum open position for the opening/closing mechanism may be imposed. The central screw may limit physical movement so that it may be screwed no more than a maximum. Additionally, the outer plates may have a maximum outward movement to limit them to form fit. If a lever is employed, the lever may be limited to a certain angle. For example 180°.

An air pressure system may be used to open and close the clamping structure instead of a screw. Air pressure may control a nut bar to press against outer plates and work against the clamping spring force to open the clamping structure. Tubing connected to multiple clamping structures in the system may deliver air pressure to open the multiple clamping structures simultaneously.

Each clamping structure may open and close around each DIMM using a different and independent mechanism such as those previously described.

FIG. 1 illustrates two views of socketed DIMMs 102. View 100A is an angled view of DIMMs 102 socketed in Da LM sockets 104 which are electrically coupled to printed circuit board (PCB) 106. View 100B is a front end view of DIMMs 102 socketed in DIMM sockets 104 which are electrically coupled to PCB 106. PCB 106 may include holes 108 at opposite ends of DIMM sockets 104. DIMM sockets 104 may electrically couple DIMMs 102 to PCB 106.

Figure 2A:
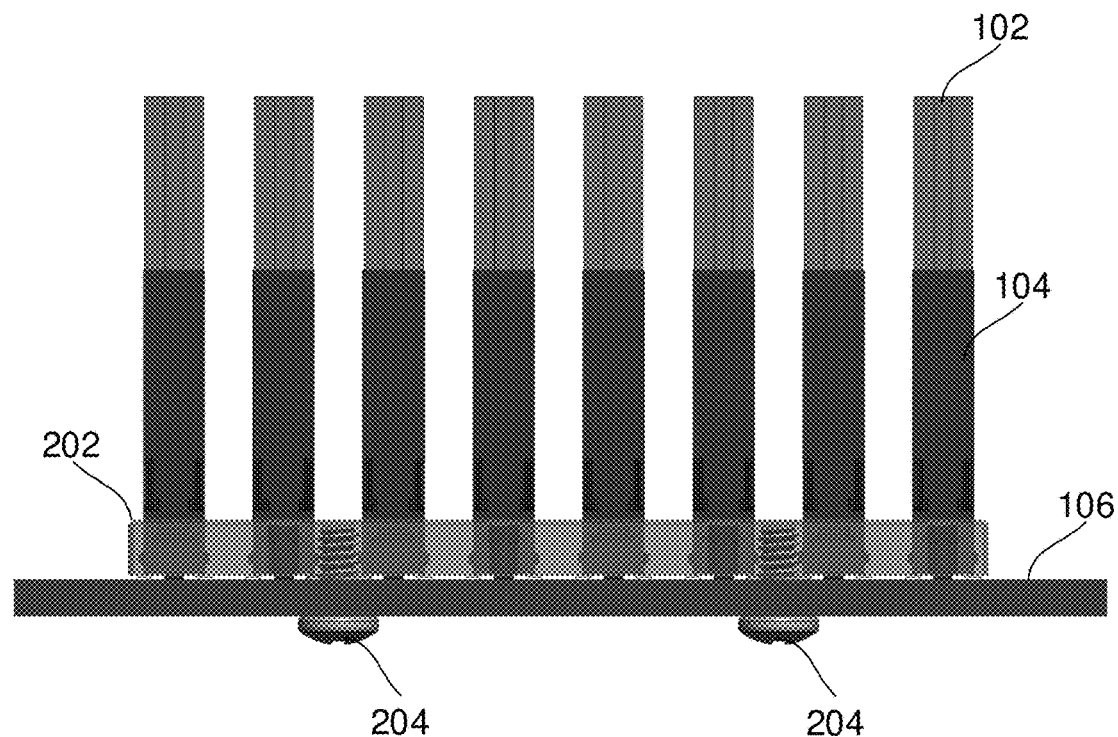
FIGS. 2A and 2B show exemplary stability bars for improved DIMM stability according to some aspects.
Figure 2A:
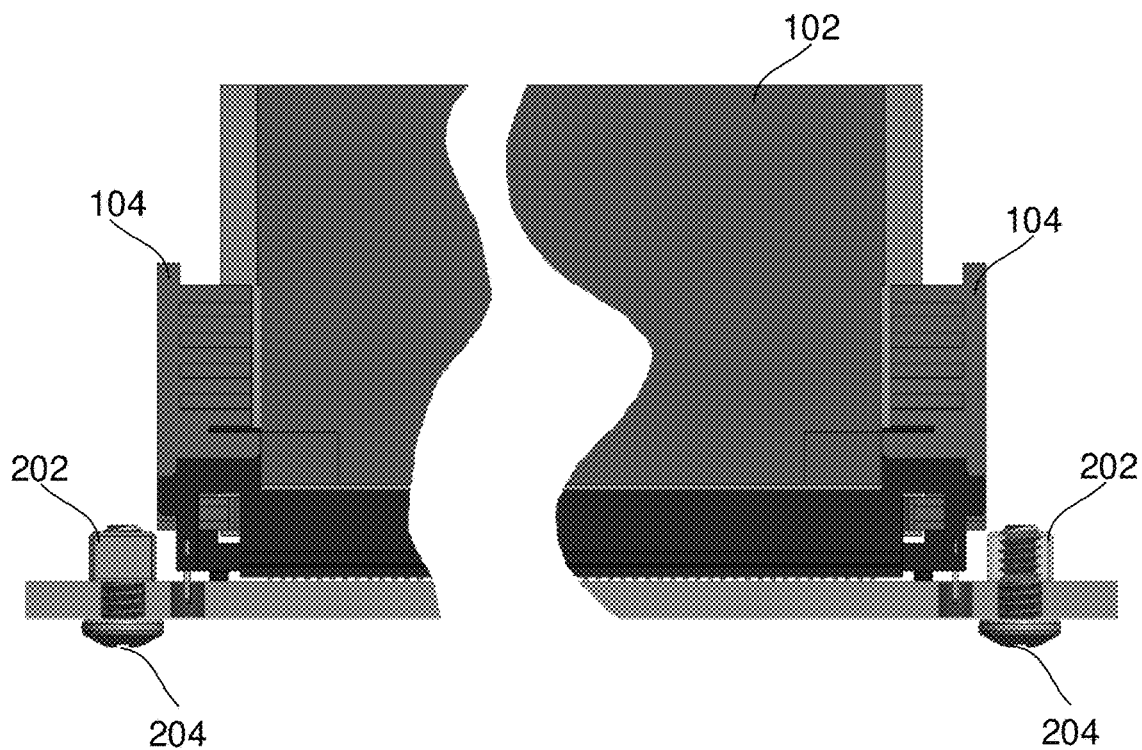

FIG. 2A illustrates a stability bar 202 fixed to PCB 106. Screws 204 may secure stability bar 202 to PCB 106. The stability bar 202 may contact PCB 106 at the point screws 204 secure stability bar 202 to PCB 106. A gap may occur between stability bar 202 and PCB 106 at points where it is not secured to PCB 106 with screws 204.

Figure 2B:
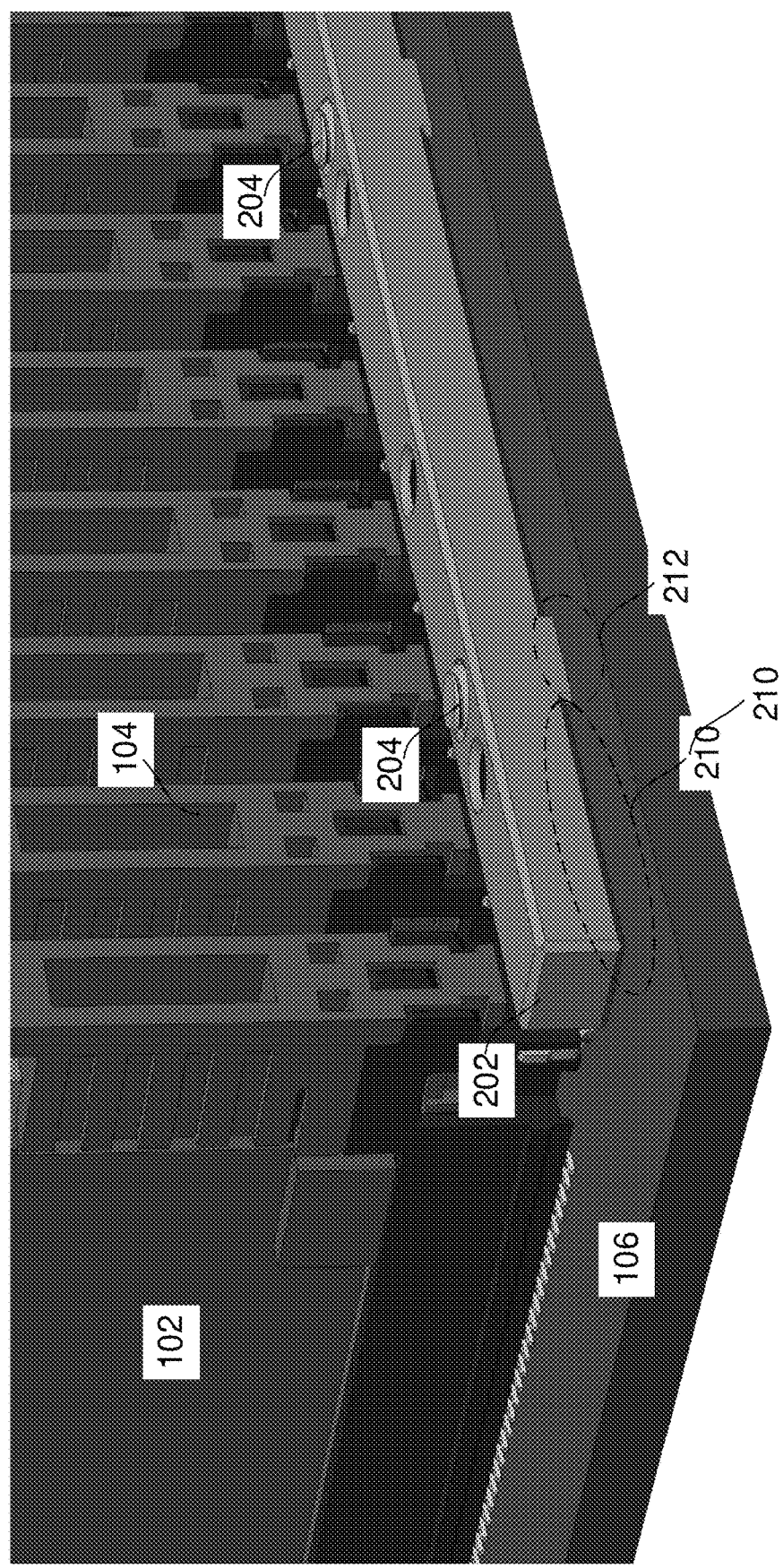

FIG. 2B illustrates a gaps and contact points between the PCB and the stability bar. Gap 210 illustrates a gap between PCB 106 and stability bar 202 at one end of the stability bar. Gaps exist between PCB 106 and stability bar 202 at points where they are not coupled to each other. Contact point. 212 illustrates a point where stability bar 202 is mechanically coupled to PCB 106. Having minimal contact points 212 reduces modifications to PCB 106.

Figure 3:
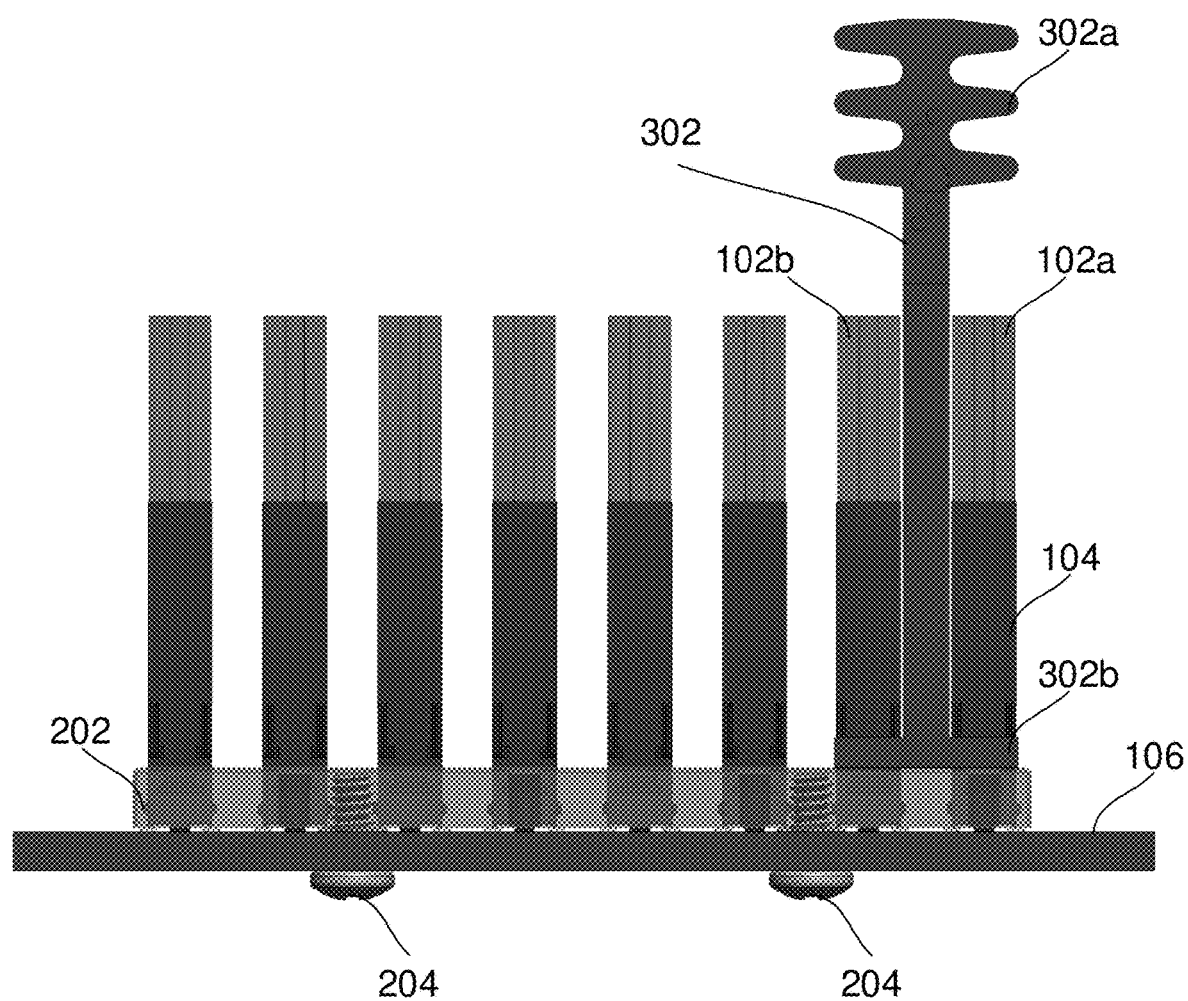
FIG. 3 shows an exemplary center plate for improved DIMM stability according to some aspects.

FIG. 3 illustrates center plate 302 positioned between two DIMMs 102a and 102b. Center plate 302 may prevent DIMMs 102a and 102b from bending toward each other. Center plate 302 made from a thermally conductive material may dissipate heat from DIMMs 102a and 102b. Center plate 302 may include fins 302a at a portion above DIMMs 102a and 102b. Center plate 302 may also include anchor 302b to secure center plate 302 to stability bar 202.

Figure 4A:
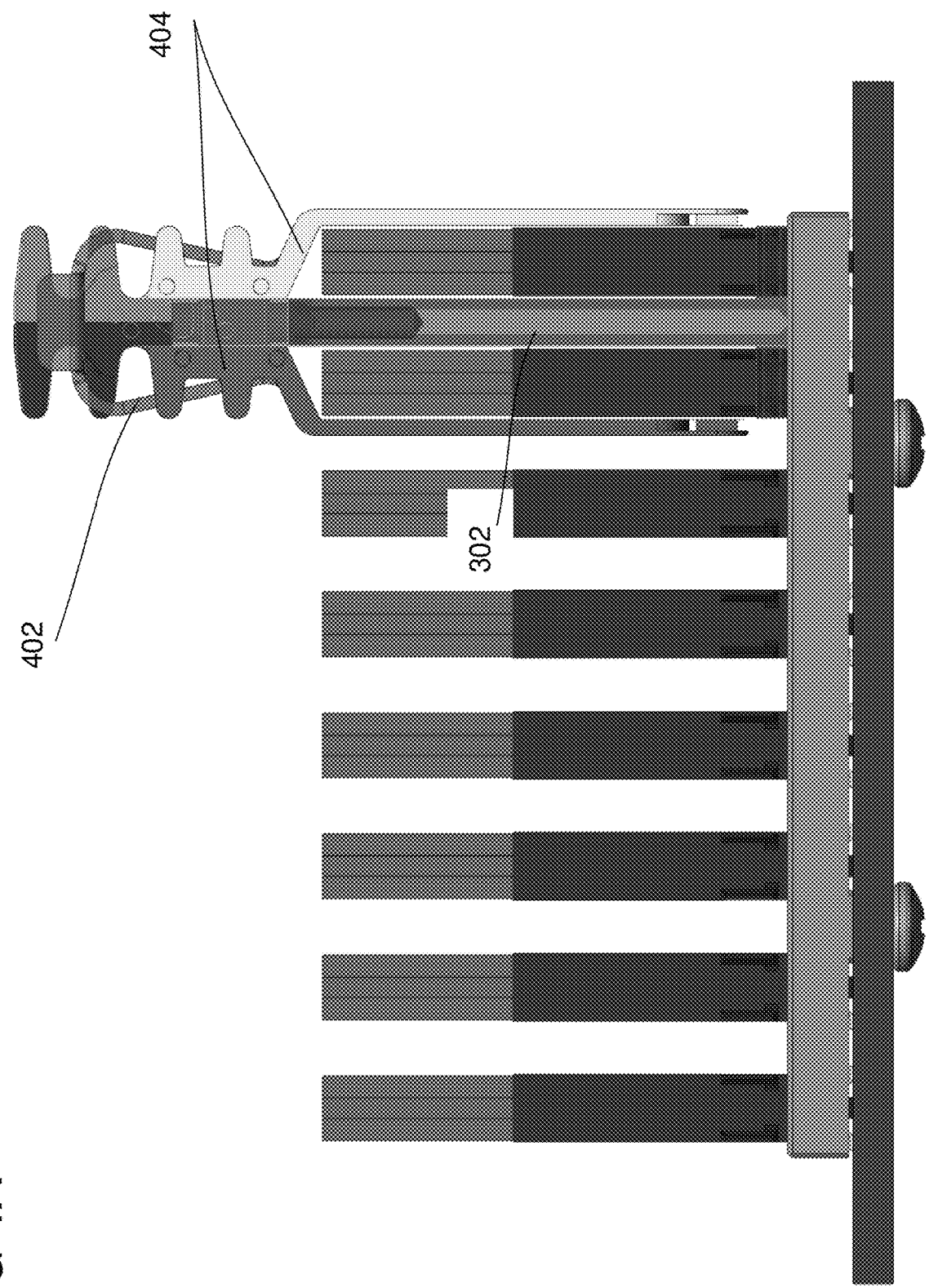
FIGS. 4A and 4B show exemplary clamping structures for improved DIMM stability according to some aspects.
Figure 4B:
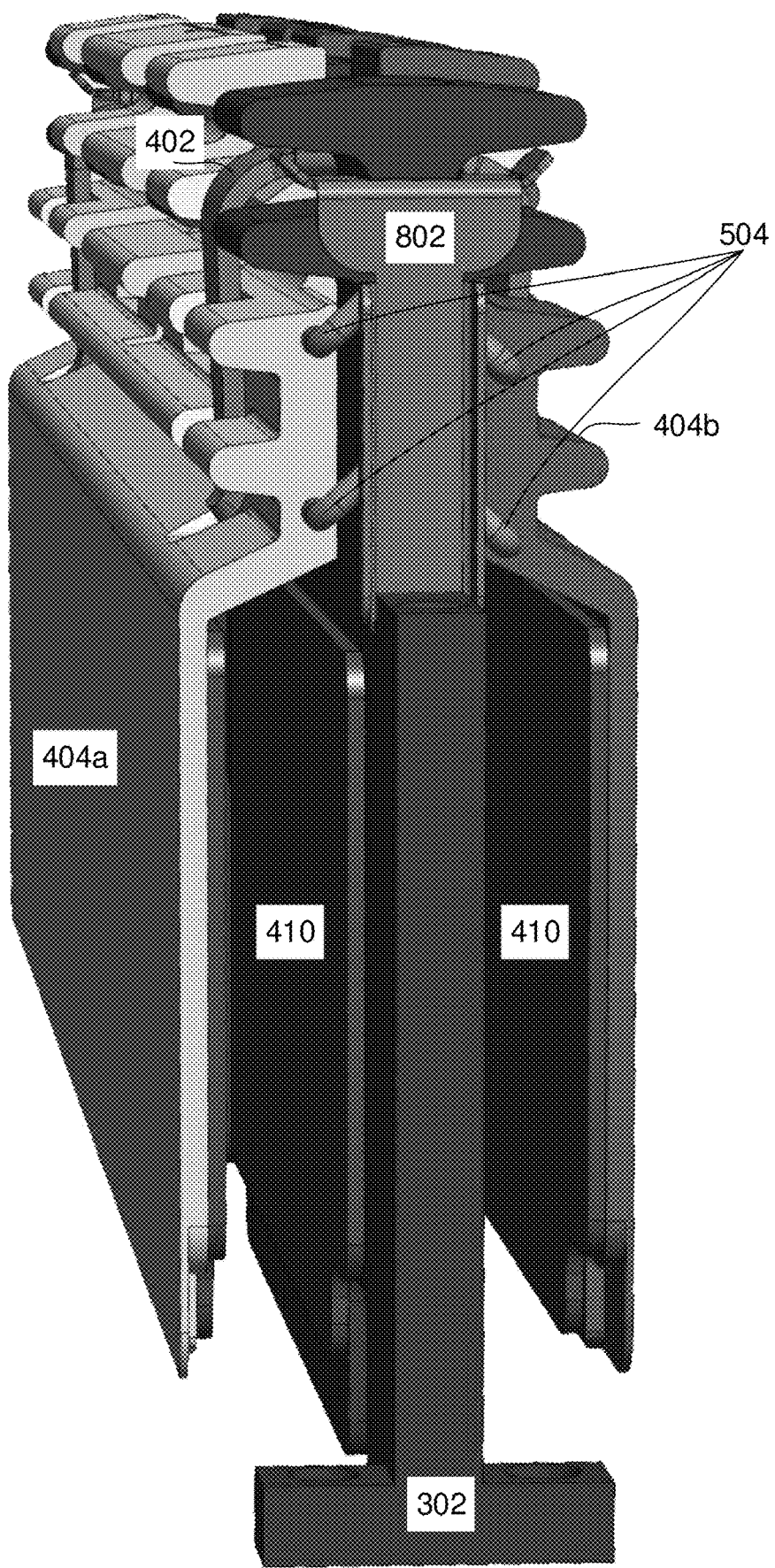

FIG. 4A illustrates outer plates 404 positioned on outside surfaces of DIMMs 102a and 102b. Outer plates 404 made from thermally conductive material may dissipate heat from DIMMs 102a and 102b. Outer plates 404 may include fins. Positioning outer plates 404 to interweave its fins between center plate 302 fins 302a may create a heat sink and aid in heat dissipation. Clamping spring 402 may secure outer plates 404 to center plate 302 prevent DIMMs 102a and 102b from bending away from each other.

FIG. 4B illustrates a pre-assembled clamping structure in a pre-opened condition prior to being installed over installed DIMMs. The clamping structure includes center plate 302, outer plates 404a and 404b, and clamping spring 402 as described in FIG. 4A. Additionally, TIM 410 may be installed on surfaces of center plate 302 and outer plates 404a and 404b to contact both inner and outer surfaces of DIMMs 102. TIM 410 may serve as a thermal interface material that improves the thermal contact between DIMMs 102 and the center 302/outer plates 404a and 404b. Additionally, the pre-assembled clamping structure may include u-wires 504 and retention spring 802 described in further detail below.

Figure 5A:
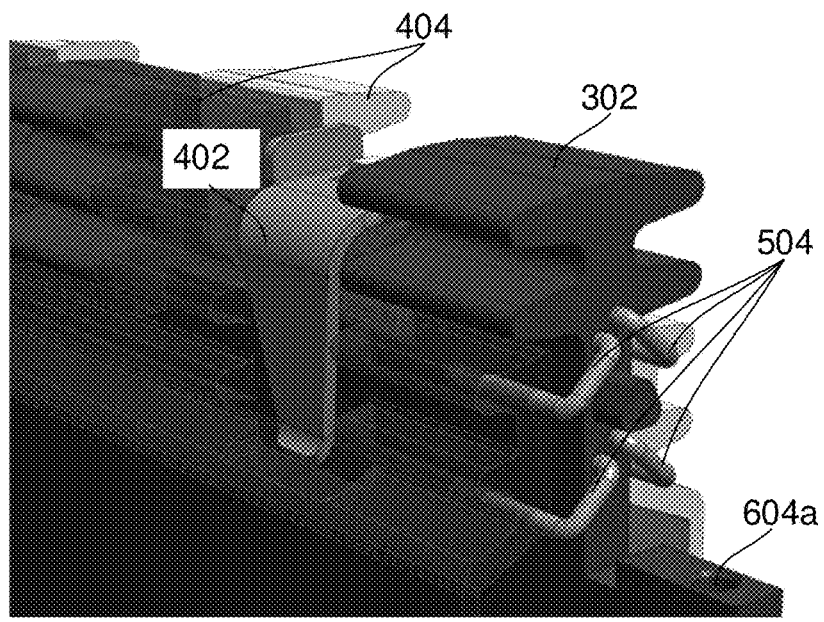
FIGS. 5A and 5B show exemplary details of a clamping spring and u-wires for improved DIMM stability according to some aspects.
Figure 5B:
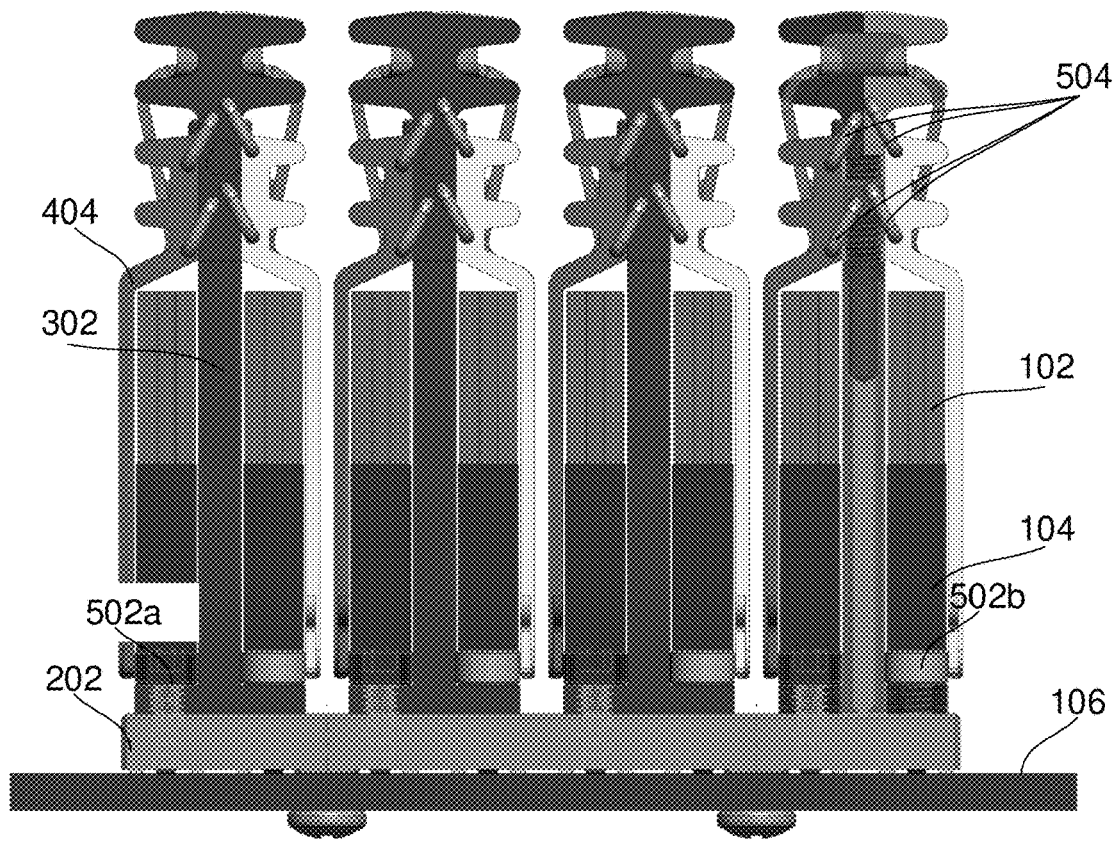

FIGS. 5A and 5B illustrate u-wires 504 which further secure outer plates 404 to center plate 302. FIG. 5A illustrates a detailed view of clamping spring 402 and u-wires 504 securing center plate 302 to outer plates 404. Inserting one end of four u-wires 504 in center plate 302 and inserting opposite ends of u-wires 504 into one of two outer plates 404 further couples outer plates 404 and center plate 302.

U-wires 504 aid in position outer plates 404 along DIMMs 102. As outer plates 404 are secured, u-wires guide their position along center plate 302. Additionally, FIG. 5A also illustrates anchor point 604a on center plate 302 used to secure additional stability bar 602 as described in FIG. 6.

FIG. 5B illustrates eight DIMMs 102 socketed in eight DIMM sockets 104 coupled to PCB 106. For example, DIMM sockets 104 may be soldered to PCB 106. Four center plates 302 are positioned between a pair of DIMMs 102 as described in FIG. 3. Eight outer plates 404 are positioned outside a pair of DIMMs 102 as described in FIG. 4. Outer plates 404 are coupled to center plate 302 via u-wires 504 as described in FIG. 5A. Screws 204 may anchor center plates 302 to stability bar 202 at anchor points 502a. Anchor points 502a may include blind hole at the base of center plate 202 which aligns with a threaded hole in stability bar 202. Screws 502b secure center plate 302 to stability bar 202 to prevent movement of center plate 302 relative to PCB 106.

Figure 6:
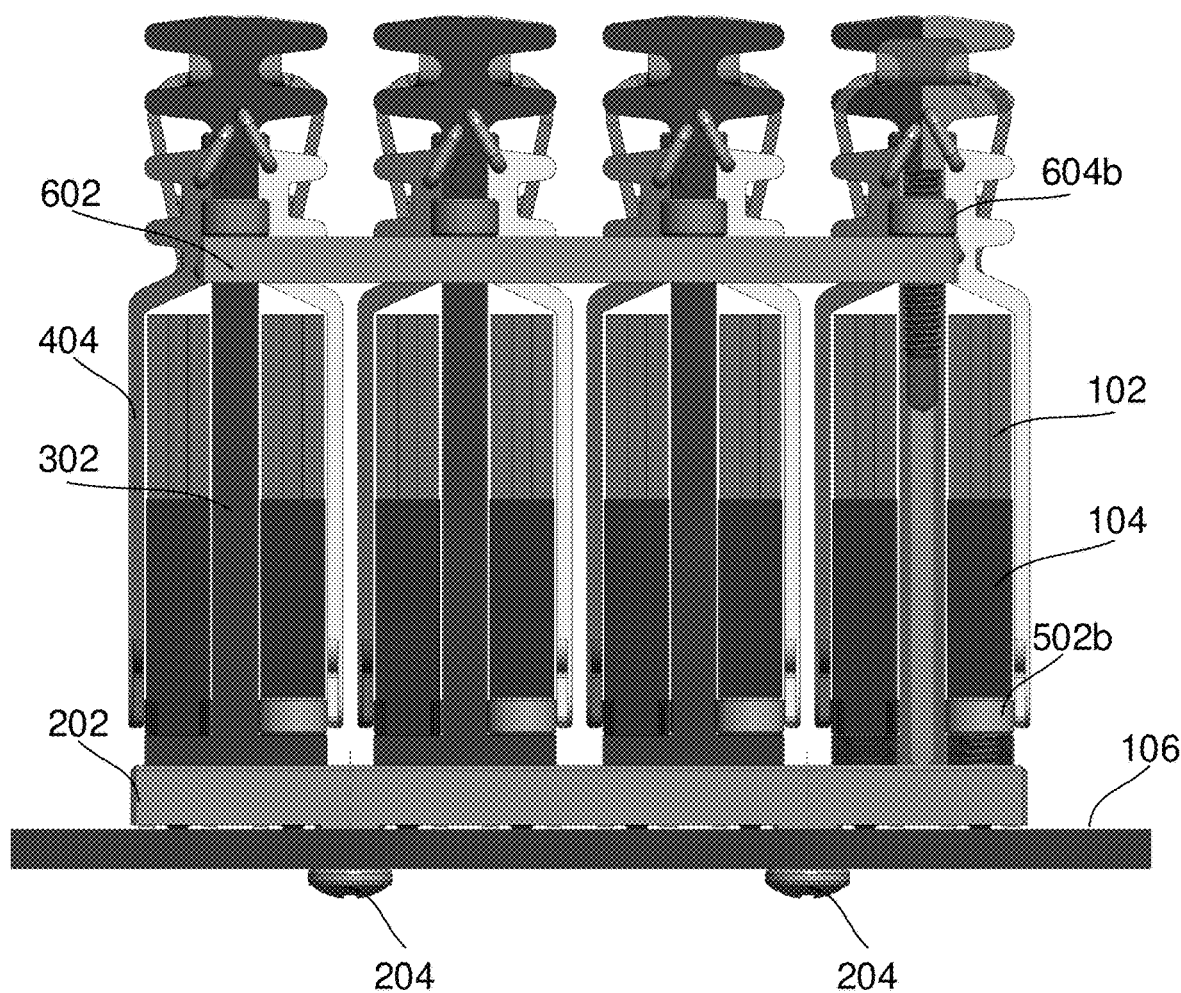
FIG. 6 shows an exemplary stability bar for improved DIMM stability according to some aspects.

FIG. 6 illustrates eight DIMMs 102 socketed in eight DIMM sockets 104 coupled to PCB 106 and secured to four center plates 302 and eight outer plates 404 as described in FIG. 5B. Screws 502b may secure center plates 302 to stability bar 202. An additional stability bar 602 may secure center plates 302 to each other. Center plate 302 may include an additional anchor points 604a (shown in FIG. 5B) at a position above DIMMs 102. Screws 604b may secure center plates 302 to additional stability bar 602 and provide more stability to DIMMs 102.

Figure 7A:
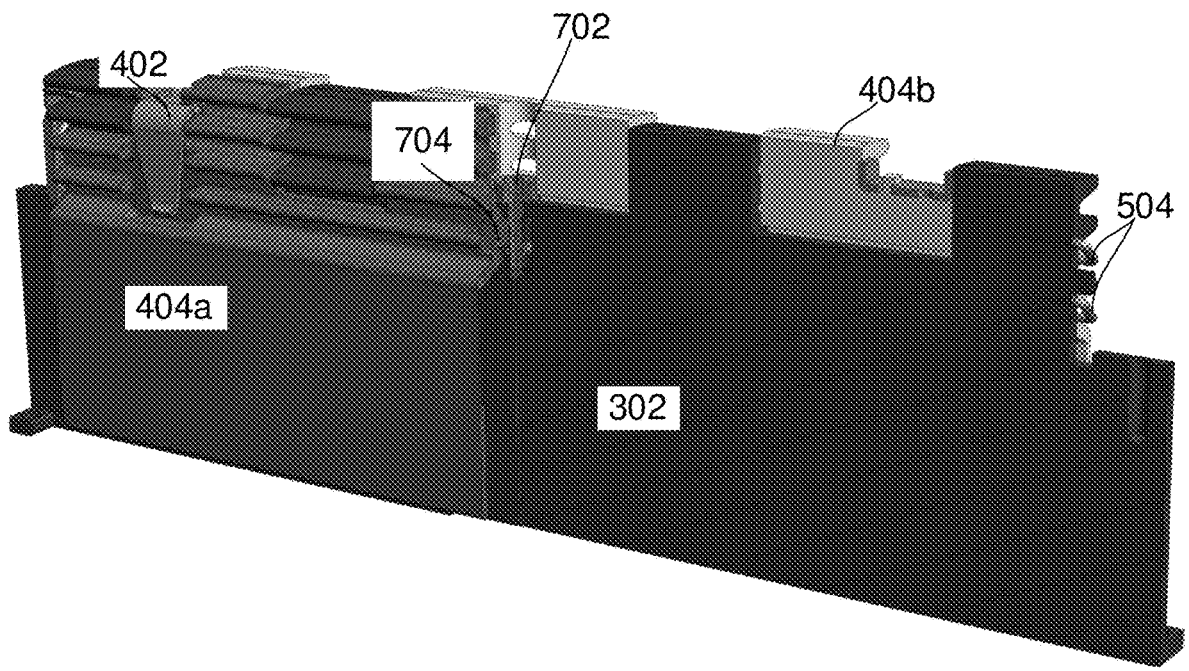
FIGS. 7A and 7B show an exemplary screw and actuator nut bar to drive opening/closing the clamping structures to a center plate according to some aspects.
Figure 7B:
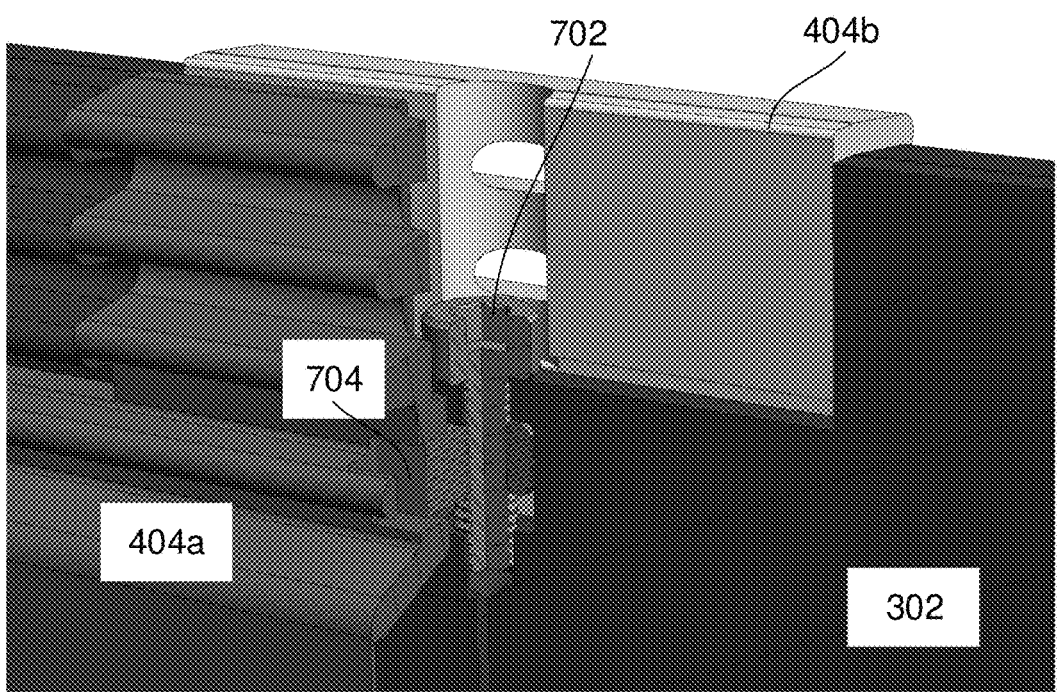

FIGS. 7A and 7B illustrate a screw 702 for opening and closing outer plates 404a and 404b. Nut 704 may include the ability to move and open/close outer plates 404a and 404b around center plate 302. Turning screw 702 counterclockwise moves nut 704 to allow the force of clamping spring 402 to clamp outer plates 404a and 404b around center plate 302. Turning screw 702 clockwise moves nut 704 to work against clamping spring 402 force to open outer plates 404a and 404b around center plate 302. U-wires 504 may guide the parallel swing movement of outer plates 404a and 404b around center plate 302.

Figure 8A:
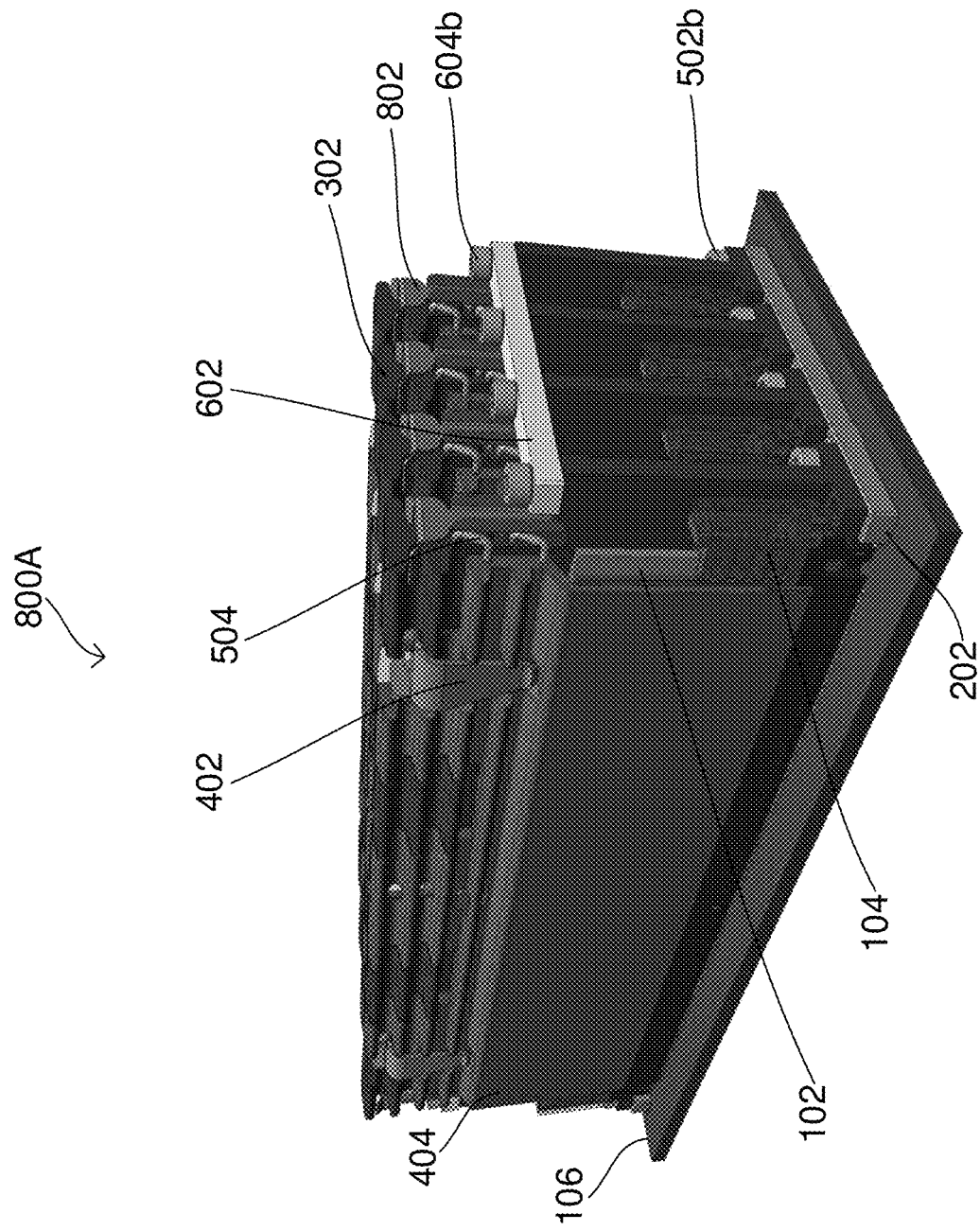

FIGS. 8A and 8B illustrate two views of systems for securing socketed DIMMs 102. FIG. 8A illustrates an angled view of system 800 including eight DIMMs 102 socketed in eight DIMM sockets 104 coupled to PCB 106 and secured to four center plates 302 and eight outer plates 404 as described in FIG. 5B. Clamping spring 402 and u-wires 504 secure out plates 404 to center plate 302. Retention springs 802 secure u-wires 504 from sliding out of center plate 302 and outer plates 404. Screws 502b may secure center plate 302 to stability bar 202 at anchor points 502a. An additional stability bar 602 may secure center plates 302 to each other. Center plate 302 may include an additional anchor points 604a (shown in FIG. 5B) at a position above DIMMs 102. Screws 604b may secure center plates 302 to additional stability bar 602 at anchor points 604a to provide more stability to DIMMs 102.

FIG. 8B illustrates a top view of system 800B similar to 800A as described in FIG. 8A. Screws 702 and clamping spring 402 secure outer plates 404a and 404b to center plate 302. Screws 702 are screwed into nut 704 (not shown) to open and close outer plates 404a and 404b around center plate 302. U-wires 504 (not shown) may guide the opening and closing motion of outer plates 404a and 404b. Retention spring 802 prevent u-wires 504 from sliding out. DIMMs 102 are secured to stability bar 202 which is further secured to PCB 106. Screws 502b secure center plate 302 to stability bar 202 at anchor points 502a. Anchor points 502a may include non-threaded holes through center plate 302 and stability bar 202. The threaded holes align to anchor points 502a to allow screws 502b to secure center plate 302 to stability bar 202. Additional stability bar 602 may prevent further movement of DIMMs 102. Screws 604b may secure additional stability bar 602 to center plates 302 at anchor points 604a. Anchor points 604a may include blind holes in center plate 302 and additional through holes in stability bar 602. The two holes align to allow screws 602b to secure center plate 302 to additional stability bar 602.

Figure 9:
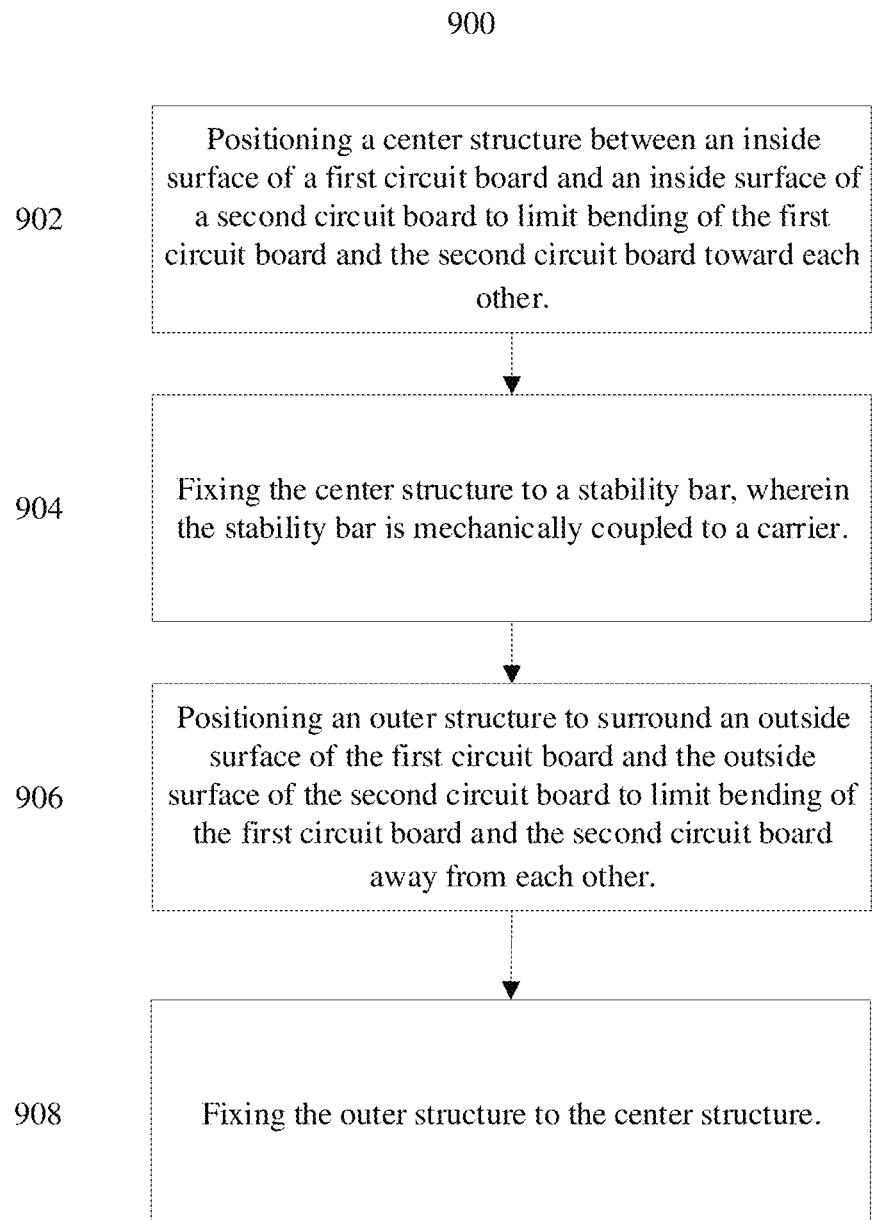
FIG. 9 shows an exemplary method of securing DIMMs to a PCB according to some aspects.

FIG. 9 illustrates an exemplary method 900 of securing circuit boards according to some aspects. As shown in FIG. 9, method 900 includes positioning a center structure between an inside surface of a first circuit board and an inside surface of a second circuit board to limit deforming of the first circuit board and the second circuit board toward each other (Step 902), fixing the center structure to a stability bar, wherein the stability bar is mechanically coupled to a carrier (Step 904), positioning an outer structure to surround an outside surface of the first circuit board and the outside surface of the second circuit board to limit bending of the first circuit board and the second circuit board away from each other (Step 906), fixing the outer structure to the center structure (Step 908).

While the above descriptions and connected figures may depict mechanical device components as separate elements, skilled persons will appreciate the various possibilities to combine or integrate discrete elements into a single element. Conversely, skilled persons will recognize the possibility to separate a single element into two or more discrete elements.

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

The following examples disclose various aspects of this disclosure:

In Example 1, a stability device including: a carrier having a first socket and a second socket; a first circuit board inserted into the first socket of the carrier; a second circuit board inserted into the second socket of the carrier, wherein an inner surface of the second circuit board is facing an inner surface of the first circuit board; a center structure positioned between the inner surface of the first circuit board and the inner surface of the second circuit board to limit an inner bending of the first circuit board and the second circuit board towards each other; an outer bending limiting structure at least partially surrounding an outer surface of the first circuit board and an outer surface of the second circuit board to limit an outer bending of the first circuit board and the second circuit board away from each other and to fix the center structure between the inner surface of the first circuit board and the inner surface of the second circuit board.

In Example 2, the subject matter of Example 1, may optionally further include a stability bar, wherein the stability bar is fixed to the carrier.

In Example 3, the subject matter of Examples 1 and 2 may optionally further include wherein the stability bar is fixed to the carrier by a plurality of screws.

In Example 4, the subject matter of Examples 1 and 3 may optionally further include a gap between a portion of the stability bar and a portion of the carrier.

In Example 5, the subject matter of Examples 1 to 4 may optionally further include wherein the center structure is fixed to the stability bar.

In Example 6, the subject matter of Examples 1 to 5 may optionally further include wherein the center structure is fixed to the stability bar by a plurality of screws.

In Example 7, the subject matter of Examples 1 to 6 may optionally further include wherein the center structure is thermally conductive.

In Example 8, the subject matter of Examples 1 to 7 may optionally further include wherein the center structure comprises a heat sink.

In Example 9, the subject matter of Examples 1 to 8 may optionally further include wherein the heat sink comprises one or more fins.

In Example 10, the subject matter of Examples 1 to 9 may optionally further include wherein the outer structure comprises a first outer plate, a second outer plate, and a clamping spring.

In Example 11, the subject matter of Examples 1 to 10 may optionally further include where in the clamping spring is a compression spring.

In Example 12, the subject matter of Examples 1 to 11 may optionally further include wherein the clamping spring is positioned over a portion of an outer surface of the first outer plate and a portion of an outer surface of the second outer plate.

In Example 13, the subject matter of Examples 1 to 12 may optionally further include wherein the clamping spring forces an inner surface of the first outer plate toward an inner surface of the second outer plate.

In Example 14, the subject matter of Examples 1 to 13 may optionally further include wherein the first outer plate is thermally conductive.

In Example 15, the subject matter of Examples 1 to 14 may optionally further include wherein the second outer plate is thermally conductive.

In Example 16, the subject matter of Examples 1 to 15 may optionally further include wherein the first outer plate comprises a heat sink.

In Example 17, the subject matter of Examples 1 to 16 may optionally further include wherein the second outer plate comprises a heat sink.

In Example 18, the subject matter of Examples 1 to 17 may optionally further include wherein the heat sink comprises one or more fins.

In Example 19, the subject matter of Examples 1 to 18 may optionally further include further comprising a thermal interface material (TIM), wherein the TIM is positioned between center structure and the inner surface of the first circuit board.

In Example 20, the subject matter of Examples 1 to 19 may optionally further include further comprising a thermal interface material (TIM), wherein the TIM is positioned between center structure and the inner surface of the second circuit board.

In Example 21, the subject matter of Examples 1 to 20 may optionally further include further comprising a thermal interface material (TIM), wherein the TIM is positioned between the inner surface of the first outer plate and the outer surface of the first circuit board.

In Example 22, the subject matter of Examples 1 to 21 may optionally further include further comprising a thermal interface material (TIM), wherein the TIM is positioned between the inner surface of the second outer plate and the outer surface of the second circuit board.

In Example 23, the subject matter of Examples 1 to 22 may optionally further include wherein the center structure comprises a loading and releasing mechanism, wherein the mechanism is configured to move the outer structure toward or away from the first circuit board and the second circuit board.

In Example 24, a method for stabilizing circuit boards including: positioning a center structure between an inner surface of a first circuit board and an inner surface of the second circuit board to limit an inward deformation; fixing the center structure to a carrier, wherein the first circuit board is inserted into a first socket of the carrier and the second circuit board is inserted into a second socket of the carrier; and clamping an outer structure at least partially surrounding an outer surface of the first circuit board and an outer surface of the second circuit board to fix the center structure between the inner surface of the first circuit board and the inner surface of the second circuit board and limit outward deformation.

In Example 25, the subject matter of Example 24 may optionally further include a stability bar, wherein the stability bar is fixed to the carrier.

In Example 26, the subject matter of Examples 24 and 25 may optionally further include wherein the stability bar is fixed to the carrier by a plurality of screws.

In Example 27, the subject matter of Examples 24 to 26 may optionally further include a gap between a portion of the stability bar and a portion of the carrier.

In Example 28, the subject matter of Examples 24 to 27 may optionally further include wherein the center structure is fixed to the stability bar.

In Example 29, the subject matter of Examples 24 to 28 may optionally further include wherein the center structure is fixed to the stability bar by a plurality of screws.

In Example 30, the subject matter of Examples 24 to 29 may optionally further include wherein the center structure is thermally conductive.

In Example 31, the subject matter of Examples 24 to 30 may optionally further include wherein the center structure comprises a heat sink.

In Example 32, the subject matter of Examples 24 to 31 may optionally further include wherein the heat sink comprises one or more fins.

In Example 33, the subject matter of Examples 24 to 32 may optionally further include wherein the outer structure comprises a first outer plate, a second outer plate, and a clamping spring.

In Example 34, the subject matter of Examples 24 to 33 may optionally further include where in the clamping spring is a compression spring.

In Example 35, the subject matter of Examples 24 to 34 may optionally further include wherein the clamping spring is positioned over a portion of an outer surface of the first outer plate and a portion of an outer surface of the second outer plate.

In Example 36, the subject matter of Examples 24 to 35 may optionally further include wherein the clamping spring forces an inner surface of the first outer plate toward an inner surface of the second outer plate.

In Example 37, the subject matter of Examples 24 to 36 may optionally further include wherein the first outer plate is thermally conductive.

In Example 38, the subject matter of Examples 24 to 37 may optionally further include wherein the second outer plate is thermally conductive.

In Example 39, the subject matter of Examples 24 to 38 may optionally further include wherein the first outer plate comprises a heat sink.

In Example 40, the subject matter of Examples 24 to 39 may optionally further include wherein the second outer plate comprises a heat sink.

In Example 41, the subject matter of Examples 24 to 40 may optionally further include wherein the heat sink comprises one or more fins.

In Example 42, the subject matter of Examples 24 to 41 may optionally further include a thermal interface material (TIM), wherein the TIM is positioned between center structure and the inner surface of the first circuit board.

In Example 43, the subject matter of Examples 24 to 42 may optionally further include a thermal interface material (TIM), wherein the TIM is positioned between center structure and the inner surface of the second circuit board.

In Example 44, the subject matter of Examples 24 to 43 may optionally further include a thermal interface material (TIM), wherein the TIM is positioned between the inner surface of the first outer plate and the outer surface of the first circuit board.

In Example 45, the subject matter of Examples 24 to 44 may optionally further include a thermal interface material (TIM), wherein the TIM is positioned between the inner surface of the second outer plate and the outer surface of the second circuit board.

In Example 46, the subject matter of Examples 24 to 45 may optionally further include wherein the center structure comprises a loading and releasing mechanism, wherein the mechanism is configured to move the outer structure toward or away from the first circuit board and the second circuit board.

In Example 47, a system comprising one or more devices according to any of Examples 1-23, the system configured to implement a method according to any of Examples 24-46.

In Example 48, a means for implementing any of the Examples 1-23.

While aspects of this disclosure have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A stability device comprising:
a carrier having a first socket and a second socket;
a first circuit board inserted into the first socket of the carrier;
a second circuit board inserted into the second socket of the carrier, wherein an inner surface of the second circuit board is facing an inner surface of the first circuit board;
a center structure positioned between the inner surface of the first circuit board and the inner surface of the second circuit board to limit an inner bending of the first circuit board and the second circuit board towards each other;
an outer bending limiting structure at least partially surrounding an outer surface of the first circuit board and an outer surface of the second circuit board, wherein the outer bending limiting structure is configured to:
limit an outer bending of the first circuit board and the second circuit board away from each other; and
fix the center structure between the inner surface of the first circuit board and the inner surface of the second circuit board,
wherein the center structure comprises a loading and releasing mechanism, wherein the mechanism is configured to move the outer bending limiting structure toward or away from the first circuit board and the second circuit board.

2. The stability device of claim 1, further comprising a stability bar, wherein the stability bar is fixed to the carrier and the center structure is fixed to the stability bar.

3. The stability device of claim 2, further comprising a plurality of gaps between the stability bar and the carrier, wherein the stability bar has a length extending in a first direction perpendicular to the first socket and the second socket and a width extending in a second direction parallel to the first socket and the second socket, wherein the stability bar is mechanically fixed to the carrier at contact points arranged intermittently along the length of the stability bar so as to form one of the plurality of gaps between the stability bar and the carrier between two consecutive contact points, the respective gap having a length that extends between two consecutive contact points and a width that extends an entire width of the stability bar.

4. The stability device of claim 1, wherein the center structure is thermally conductive.

5. The stability device of claim 1, wherein the center structure comprises a heat sink.

6. The stability device of claim 1, wherein the outer bending limiting structure comprises a first outer plate, a second outer plate, and a clamping spring.

7. The stability device of claim 6, wherein the clamping spring is positioned over a portion of an outer surface of the first outer plate and a portion of an outer surface of the second outer plate.

8. The stability device of claim 7, wherein the clamping spring forces an inner surface of the first outer plate toward an inner surface of the second outer plate.

9. The stability device of claim 8, wherein the first outer plate is thermally conductive and the second outer plate is thermally conductive.

10. The stability device of claim 1, further comprising a thermal interface material (TIM), wherein the TIM is positioned between center structure and the inner surface of the first circuit board and the inner surface of the second circuit board.

11. The stability device of claim 10, wherein the TIM is positioned between and inner surface of the outer bending limiting structure and the outer surface of the first circuit board and the outer surface of the second circuit board.

12. A method for stabilizing circuit boards comprising:
positioning a center structure between an inner surface of a first circuit board and an inner surface of the second circuit board to limit an inward deformation;
fixing the center structure to a carrier, wherein the first circuit board is inserted into a first socket of the carrier and the second circuit board is inserted into a second socket of the carrier; and
clamping an outer bending limiting structure at least partially surrounding an outer surface of the first circuit board and an outer surface of the second circuit board, wherein the outer bending limiting structure is configured to
limit an outward movement of the first circuit board and the second circuit board away from each other, and fix the center structure between the inner surface of the first circuit board and the inner surface of the second circuit board,
wherein the center structure comprises a loading and releasing mechanism, wherein the mechanism is configured to move the outer bending limiting structure toward or away from the first circuit board and the second circuit board.

13. The method of claim 12, further comprising fixing a stability bar to the carrier and fixing the center structure to the stability bar.

14. The method of claim 13, wherein fixing the stability bar to the carrier forms a plurality of gaps between the stability bar and the carrier, wherein the stability bar has a length extending in a first direction perpendicular to the first socket and the second socket and a width extending in a second direction parallel to the first socket and the second socket, wherein the stability bar is mechanically fixed to the carrier at contact points arranged intermittently along the length of the stability bar so as to form one of the plurality of gaps between the stability bar and the carrier between two consecutive contact points, the respective gap having a length that extends between two consecutive contact points and a width that extends an entire width of the stability bar.

15. The method of claim 12, wherein the center structure is thermally conductive.

16. The method of claim 12, wherein the center structure comprises a heat sink.

17. The stability device of claim 1, wherein the center structure comprises a center plate, a top portion of the center plate includes fins extending horizontally over the first circuit board and the second circuit board, and wherein the outer bend limiting structure comprises a first outer plate and a second outer plate, wherein a top portion of the first outer plate includes fins extending horizontally over the first circuit board and a top portion of the second outer plate includes fins extending horizontally over the second circuit board.

18. The stability device of claim 17, wherein the center plate, the first outer plate, and the second outer plate are disposed so as to interweave the fins of the first and second outer plates between the fins of the center plate.

19. The stability device of claim 18, wherein the top portion of the first outer plate and the top portion of the second outer plate are coupled to the top portion of the center plate, wherein the center plate acts as a fixed bearing with reference to the movement of the first outer plate and the second outer plate.

20. The stability device of claim 19, wherein the first outer plate and the second outer plate are configured to move toward and away from the first circuit board and the second circuit board respectively in a parallel swing motion, scissor motion, lever motion, or rotational motion.

* * * * *